(12) United States Patent
Liu et al.

(10) Patent No.: US 10,629,650 B2
(45) Date of Patent: Apr. 21, 2020

(54) INTEGRATED CIRCUITS WITH MEMORY CELLS AND METHODS FOR PRODUCING THE SAME

(71) Applicant: Globalfoundries Singapore Pte. Ltd., Singapore (SG)

(72) Inventors: Hongxi Liu, Singapore (SG); Baolei Wu, Singapore (SG); Narayanapillai Kulothungasagaran, Singapore (SG); Subash Pattabiraman Lakshmipathi, Singapore (SG); Yew Tuck Clament Chow, Singapore (SG); Curtis Chun-I Hsieh, Singapore (SG); Yi Jiang, Singapore (SG); Jin Ho Lee, Singapore (SG); Yong Wee Francis Poh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/115,956

(22) Filed: Aug. 29, 2018

(65) Prior Publication Data

US 2020/0075668 A1 Mar. 5, 2020

(51) Int. Cl.
*H01L 43/08* (2006.01)
*H01L 43/12* (2006.01)
*H01L 27/22* (2006.01)

(52) U.S. Cl.
CPC .......... *H01L 27/228* (2013.01); *H01L 43/08* (2013.01); *H01L 43/12* (2013.01)

(58) Field of Classification Search
None
See application file for complete search history.

(56) References Cited

U.S. PATENT DOCUMENTS 10,243,020 B1 * 3/2019 Clevenger ............. H01L 27/228
2016/0093670 A1 * 3/2016 Jiang .................... H01L 27/222
257/421

* cited by examiner

*Primary Examiner* — Robert K Carpenter
(74) *Attorney, Agent, or Firm* — Yee Tze Lim; Hoffman Warnick LLC

(57) ABSTRACT

Integrated circuits and methods of producing the same are provided. In an exemplary embodiment, a method of producing an integrated circuit includes forming a lower contact in a lower interlayer dielectric layer. A base contact layer is formed overlying the lower interlayer dielectric layer and the lower contact, and a base contact is formed by removing a portion of the base contact layer. The base contact is formed in electrical communication with the lower contact. A base interlayer dielectric layer is formed overlying the lower interlayer dielectric layer after forming the base contact, where the base interlayer dielectric layer is adjacent to a base contact side surface. A memory cell is formed overlying the base contact, where the memory cell is in electrical communication with the base contact.

19 Claims, 6 Drawing Sheets

INTEGRATED CIRCUITS WITH MEMORY CELLS AND METHODS FOR PRODUCING THE SAME

TECHNICAL FIELD

The technical field generally relates to integrated circuits with memory cells and methods of producing the same, and more particularly relates to integrated circuits with base contacts having reduced top surface areas that minimize short formation, and methods of producing the same.

BACKGROUND

Magnetoresistive Random Access Memory (MRAM) is an emerging technology that may be competitive with prior integrated circuit memory technologies, such as floating gate technology. The MRAM technology may integrate silicon-based electronic components with magnetic tunnel junction technology. A significant element in MRAM is the magnetic tunnel junction (MTJ) where information may be stored. A MTJ stack has at least two magnetic layers separated by a non-magnetic barrier, where a fixed layer has a set magnetic property and a free layer has a programmable magnetic property for storing information. If the fixed layer and the free layer have parallel magnetic poles, the resistance through the MTJ stack is measurably less than if the fixed layer and the free layer have anti-parallel poles, so parallel magnetic poles may be read as a "0" and anti-parallel poles may be read as a "1." The MTJ stack is typically incorporated into a memory cell, and many memory cells with MTJ stacks are incorporated into a memory bank.

Contacts are formed underlying the MTJ stack, where the contacts are utilized to integrate the MTJ stack into the integrated circuit. The contacts pass through interlayer dielectrics, and are typically formed by etching a via through the interlayer dielectric and then filling the via with an electrically conductive material. When the top surface area of the base contact is larger than a memory cell bottom surface area that overlies the base contact, the overlap of conductive material from the base contact can produce shorts that impair the function of the memory cell. However, forming a narrow via for the base contact produces a high aspect ratio of the via depth to the via width. This high aspect ratio often results in voids or gaps within the conductive material of the contact that is formed within the via. The voids in the contact undesirably reduce the strength and conductivity of the contact.

Accordingly, it is desirable to provide integrated circuits with memory cells and underlying base contacts, where a base contact top surface area is less than a memory cell bottom surface area, and methods of producing the same. In addition, it is desirable to provide integrated circuits with fewer shorts than comparable integrated circuits with wider base contacts, and methods of producing the same. Furthermore, other desirable features and characteristics of the present embodiments will become apparent from the subsequent detailed description and the appended claims, taken in conjunction with the accompanying drawings and this background.

BRIEF SUMMARY

Integrated circuits and methods of producing the same are provided. In an exemplary embodiment, a method of producing an integrated circuit includes forming a lower contact in a lower interlayer dielectric layer. A base contact layer is formed overlying the lower interlayer dielectric layer and the lower contact, and a base contact is formed by removing a portion of the base contact layer. The base contact is formed in electrical communication with the lower contact. A base interlayer dielectric layer is formed overlying the lower interlayer dielectric layer after forming the base contact, where the base interlayer dielectric layer is adjacent to a base contact side surface. A memory cell is formed overlying the base contact, where the memory cell is in electrical communication with the base contact.

A method of producing an integrated circuit is provided in another exemplary embodiment. The method includes forming a lower contact in a lower interlayer dielectric layer, and forming a base contact layer overlying the lower interlayer dielectric layer and the lower contact. A base contact is formed by removing a portion of the base contact layer, where the base contact is in electrical communication with the lower contact. The base contact has a base contact top surface area. A memory cell is formed overlying the base contact, where the memory cell has a memory cell bottom surface area that is greater than the base contact top surface area, and where the memory cell is in electrical communication with the base contact.

An integrated circuit is provided in yet another embodiment. The integrated circuit includes a base interlayer dielectric layer and a base contact extending through the base interlayer dielectric layer. The base contact has a base contact top surface area. A memory cell overlies the base contact, and is in electrical communication with the base contact. The memory cell has a memory cell bottom surface area that is greater than the base contact top surface area.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and processes described herein may be incorporated into a more comprehensive procedure having additional processes or functionality not described in detail herein. In particular, various processes in the manufacture of integrated circuits are well-known and so, in the interest of brevity, many conventional processes will only be mentioned briefly herein or will be omitted entirely without providing the well-known process details.

An integrated circuit includes a thin base contact underlying a memory cell to reduce shorts. A base contact layer is formed and etched to produce the thin base contact prior to forming a base interlayer dielectric layer that is adjacent to a base contact side surface. By forming the base contact before the base interlayer dielectric layer, the width of the base contact can be reduced without forming voids or gaps within the base contact. The reduced width of the base contact reduces electrical shorts with the overlying memory cells, which can be formed with a memory cell bottom surface area that is greater than a base contact top surface area.

Figure 1:
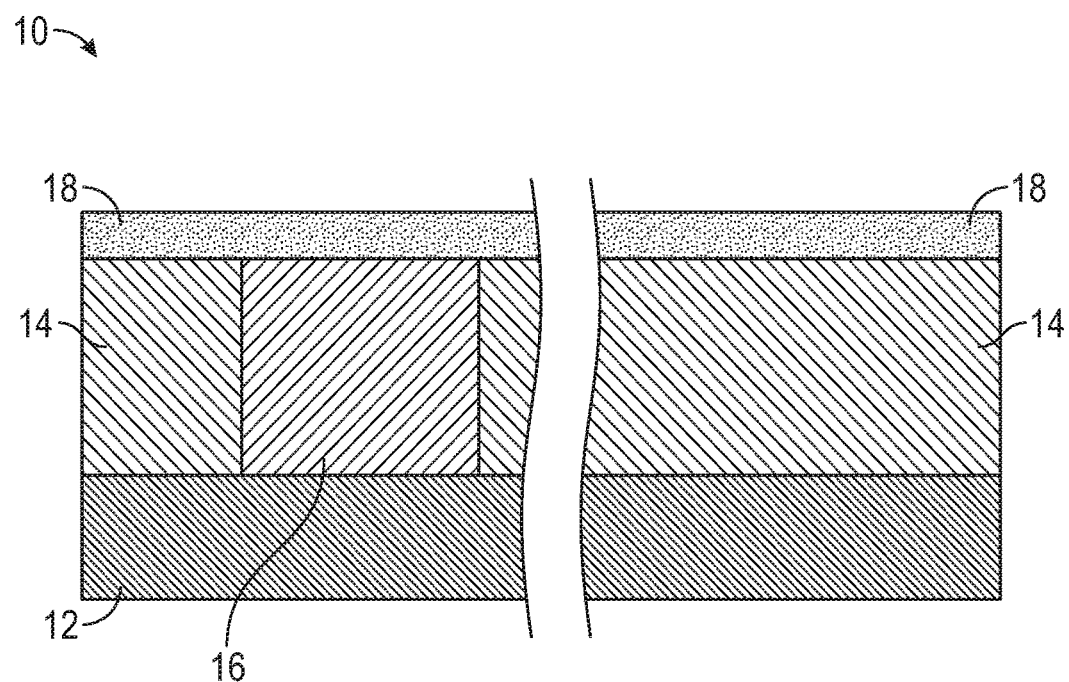
FIGS. 1-5 and 7-10 are cross sectional views of embodiments of an integrated circuit, and methods for producing the same.

Reference is made to FIG. 1. An integrated circuit 10 includes a substrate 12 formed of a semiconductor material. FIG. 1 illustrates the substrate 12 directly under a lower interlayer dielectric layer 14, but in many embodiments there are one or more layers between the substrate 12 and the lower interlayer dielectric layer 14. Illustration of the substrate 12 directly under the lower interlayer dielectric layer 14 is intended to show relative positions, with the understanding that intervening layers are typically present. For example, one, two, or more interlayer dielectric layers (not illustrated) may be formed between the substrate 12 and the lower interlayer dielectric layer 14, and a wide range of electronic components may be formed under, over, or within the various interlayer dielectric layers, such as transistors, capacitors, resistors, contacts, interconnects, etc. As such, the close proximity of the substrate 12 and the lower interlayer dielectric layer 14 as illustrated is not intended to limit the position of the lower interlayer dielectric layer 14 or the substrate 12. The FIGURES also illustrate two separate portions of the integrated circuit 10 to illustrate processes at the different locations.

As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least about 10 weight percent or more based on the total weight of the referenced component or material, unless otherwise indicated. In many embodiments, the substrate 12 primarily includes a monocrystalline semiconductor material. The term "primarily includes," as used herein, means the specified material is present in the specified component at a concentration of at least about 50 weight percent, based on a total weight of the component. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

The lower interlayer dielectric layer 14 overlies the substrate 12, as mentioned above. As used herein, the term "overlying" means "over" such that an intervening layer may lie between the overlying component (the lower interlayer dielectric layer 14 in this example) and the underlying component (the substrate 12 in this example), or "on" such that the overlying component physically contacts the underlying component. Moreover, the term "overlying" means a vertical line passing through the overlying component also passes through the underlying component, such that at least a portion of the overlying component is directly over at least a portion of the underlying component. It is understood that the integrated circuit 10 may be moved such that the relative "up" and "down" positions change, and the integrated circuit 10 can be operated in any orientation. Spatially relative terms, such as "top", "bottom", "over" and "under" are made in the context of the orientation of the FIGURES It is to be understood that spatially relative terms refer to the orientation in the figures, so if the integrated circuit 10 were to be oriented in another manner the spatially relative terms would still refer to the orientation depicted in the FIGURES. Thus, the exemplary terms "over" and "under" remain the same even if the device is twisted, flipped, or otherwise oriented other than as depicted in the figures.

A lower contact 16 is positioned in the lower interlayer dielectric layer 14, where the lower contact 16 passes through the lower interlayer dielectric layer 14. The lower contact 16 is a conductive material, such as copper, aluminum, or other conductive materials, and the lower interlayer dielectric layer 14 is an electrically insulating material. In an exemplary embodiment, the lower interlayer dielectric layer 14 includes silicon dioxide, but other electrically insulating materials may be utilized in alternate embodiments. As used herein, an "electrically insulating material" is a material with a resistivity of about $1 \times 10^4$ ohm meters or more, an "electrically conductive material" is a material with a resistivity of about $1 \times 10^4$ ohm meters or less, and an "electrically semiconductive material" is a material with a resistivity of from about more than $1 \times 10^4$ ohm meters to less than about $1 \times 10^4$ ohm meters.

The lower contact 16 may be formed in the lower interlayer dielectric layer 14 in a variety of manners, as known to those skilled in the art. In an exemplary embodiment, the lower interlayer dielectric layer 14 is formed by chemical vapor deposition using tetraethylorthosilicate, and a via is formed in the lower interlayer dielectric layer 14 using lithography and a reactive ion etch. The via is filled with a conductive material, and the overburden is removed with chemical mechanical planarization. However, other techniques, processes, or materials may be used in alternate embodiments.

A block layer 18 is formed overlying the lower contact 16 and the lower interlayer dielectric layer 14 in an exemplary embodiment. In a specific, non-limiting embodiment, the block layer 18 may be formed of a silicon carbide-based passivation material layer including nitrogen. In one example, silicon carbide with nitrogen deposited using chemical vapor deposition (CVD) from a trimethylsilane source, which is commercially available from Applied Materials under the tradename of BLOK™ or NBLOK™, is used as the block layer 18. The compound with less nitrogen (N) (less than about 5 mole %), i.e., $Si_aC_bN_cH_d$, is referred to as "BLOK™", and the compound with more N (about 10 mole % to about 25 mole %), i.e., $Si_wC_xN_yH_z$, is referred to as "NBLOK™" BLOK™ has a lower dielectric constant of less than 4.0, whereas NBLOK™ has a dielectric constant of about 5.0. While BLOK™ is not a good oxygen barrier but is a good copper (Cu) barrier, NBLOK™ is both a good oxygen barrier and a good Cu barrier. The block layer 18 may include BLOK™, NBLOK™, or other electrically insulating materials in various embodiments.

Figure 2:
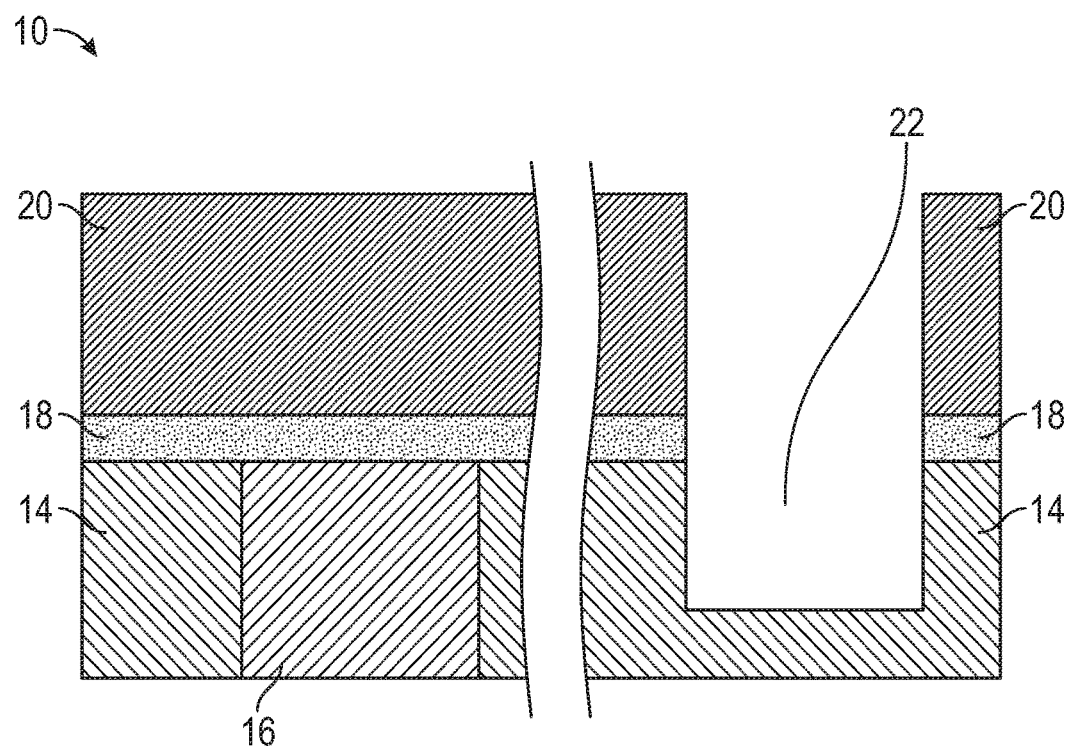

An alignment photoresist layer 20 is formed and patterned overlying the block layer 18 in an exemplary embodiment, as illustrated in FIG. 2. The alignment photoresist layer 20 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the alignment photoresist layer 20 remains overlying the other areas of the block layer 18. The alignment photoresist layer 20 (and other photoresist layers described below) may optionally include a top and/or bottom anti-reflective coating and/or a hard mask (not illustrated). Many anti-reflective coatings are available, including inorganic and organic compounds, such as titanium nitride or organosiloxanes. Titanium nitride may be deposited by chemical vapor deposition using tetramethylamidotitanium and nitrogen trifluoride, and organosiloxanes may be deposited by spin coating. Anti-reflective coatings may improve the accuracy and critical dimensions during photoresist patterning. Silicon nitride may be used as a hard mask, where silicon nitride can be formed by low pressure chemical vapor deposition using ammonia and dichlorosilane.

The alignment photoresist layer 20 is patterned to expose a portion of the block layer 18. An alignment mark trench 22 is formed in the lower interlayer dielectric layer 14 in an exemplary embodiment. The alignment mark trench 22 may be formed by reactive ion etch using carbon tetrafluoride, but other etchants or etch techniques may be utilized in alternate embodiments. For example, different etchants or etch techniques may be utilized to etch the block layer 18 and the lower interlayer dielectric layer 14, but in some embodiments both layers are etched in one process. The depth of the alignment mark trench 22 is determined by the timing of the etch process in an exemplary embodiment. In an exemplary embodiment, the alignment mark trench 22 extends into the lower interlayer dielectric layer 14, but does not pass completely through the lower interlayer dielectric layer 14. The alignment photoresist layer 20 is removed after use, such as with an oxygen containing plasma or with appropriate solvents.

Figure 3:
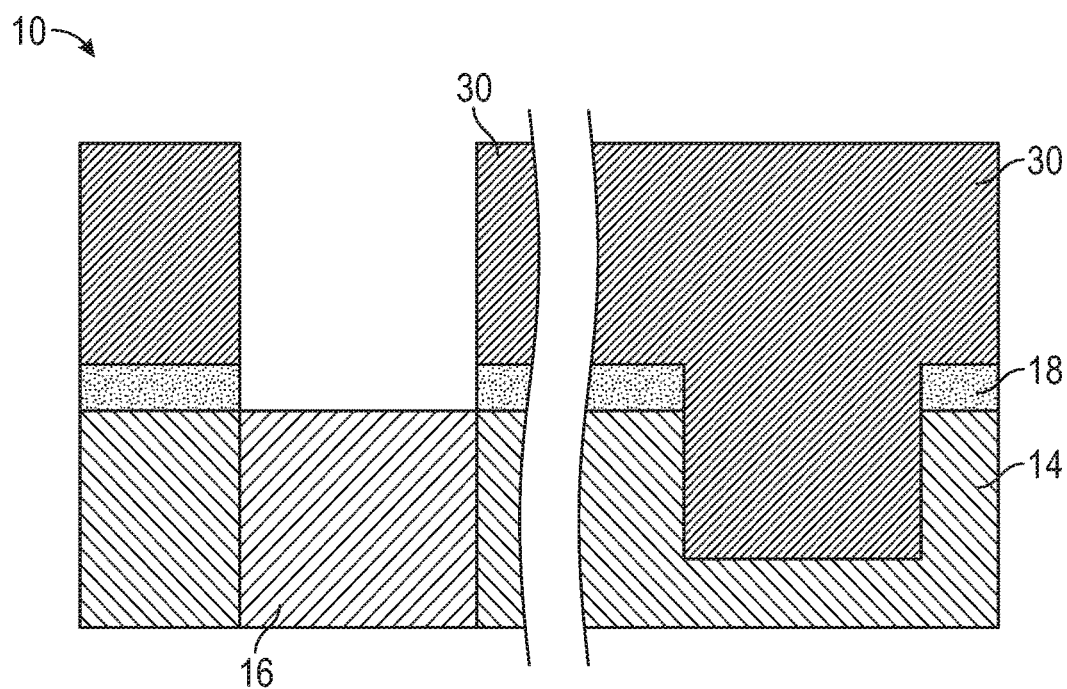

Referring to an exemplary embodiment in FIG. 3, the lower contact 16 is exposed by removing a portion of the block layer 18 that directly overlies the lower contact 16. In an exemplary embodiment, a lower contact photoresist layer 30 is formed and patterned, as described above, to expose the block layer 18 directly overlying the lower contact 16. The exposed portion of the block layer 18 is then selectively removed, such as with a reactive ion etch or a wet etch using hot phosphoric acid. The lower contact photoresist layer 30 is then removed.

Figure 4:
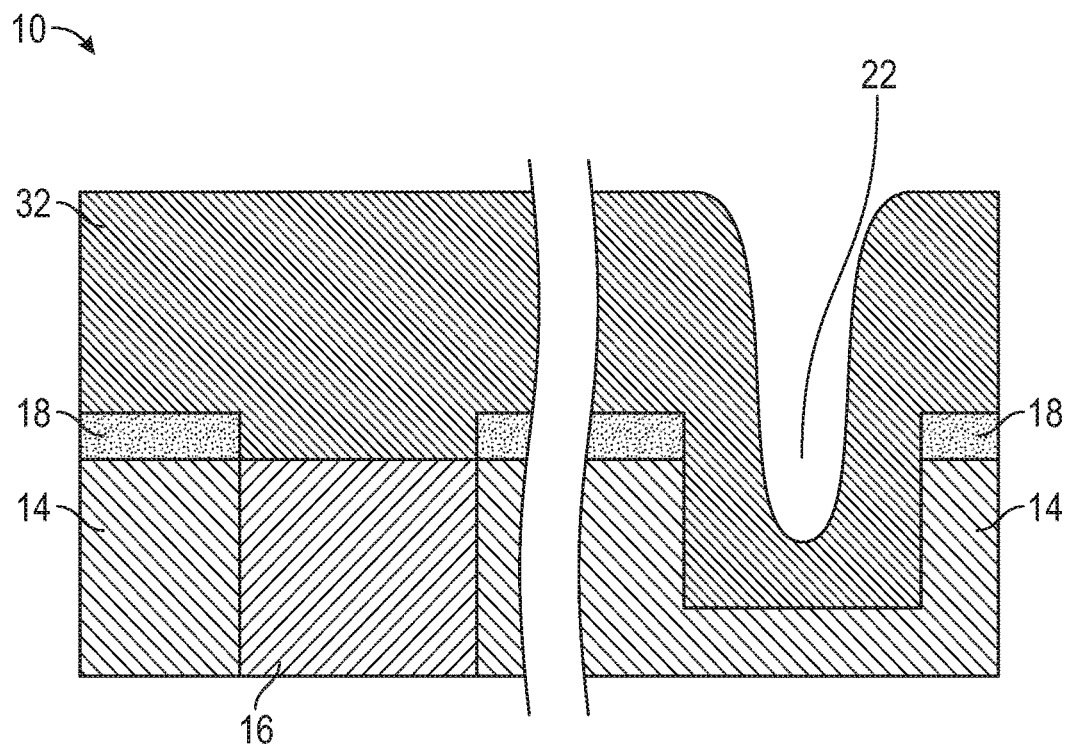

A base contact layer 32 is formed overlying the exposed lower contact 16, over the remaining block layer 18, and within the alignment mark trench 22, as illustrated in an exemplary embodiment in FIG. 4. The alignment mark trench 22 is much larger than the lower contact 16, despite the relative sizes in the illustration, where the alignment mark trench may be from about 1 to about 2 microns wide and the base contact layer 32 may be from about 1 to about 100 nanometers thick. Therefore, the base contact layer 32 does not completely fill the alignment mark trench 22. The base contact layer 32 is an electrical conductor, and may include tantalum nitride in an exemplary embodiment. Tantalum nitride may be formed by chemical vapor deposition using tetramethylamidotitanium and nitrogen trifluoride at from about 0.1 to about 10 torr and about 500° C., but other deposition techniques are also possible. In generally the base contact layer 32 is selected from materials effective for use as a base contact underlying an MTJ stack. For example, the base contact layer 32 may include one or more metals having an atomic number of 22 to 33, 40 to 52, 57 to 85, and 88 to 117. In another embodiment, the base contact layer 32 includes one or more metals having an atomic number of 72 to 85. In yet another embodiment, the base contact layer 32 includes tantalum nitride, titanium nitride, or a combination thereof.

Figure 5:
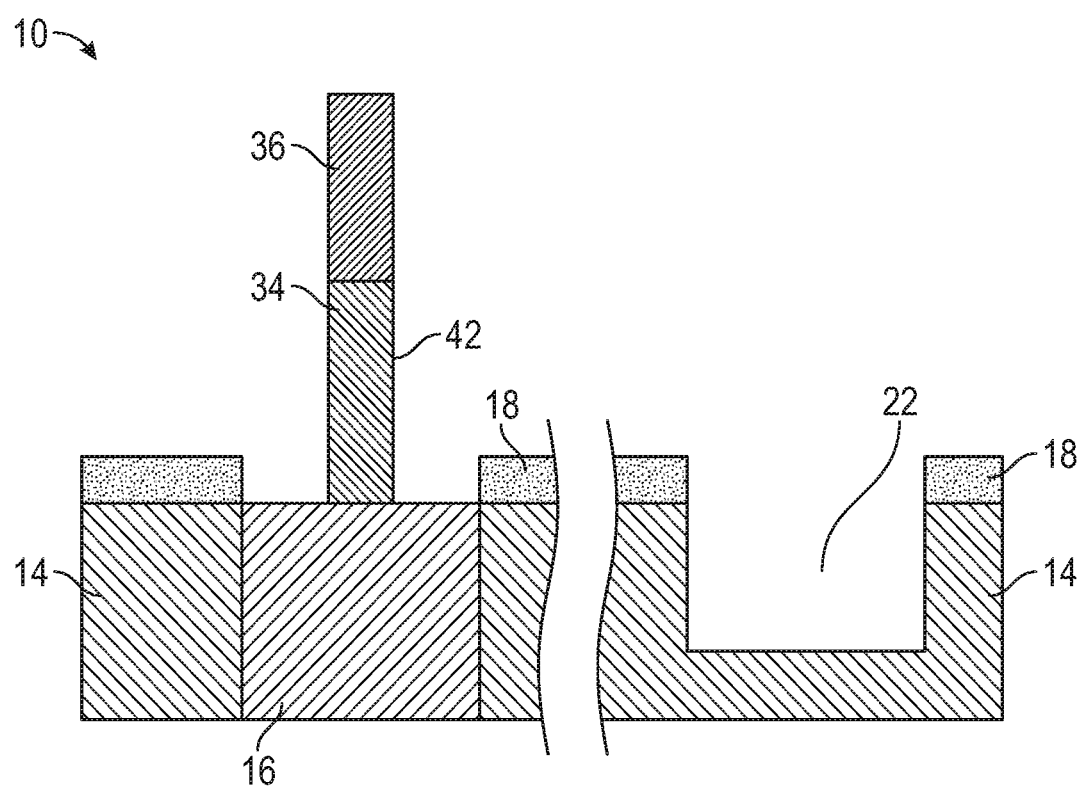
Figure 6:
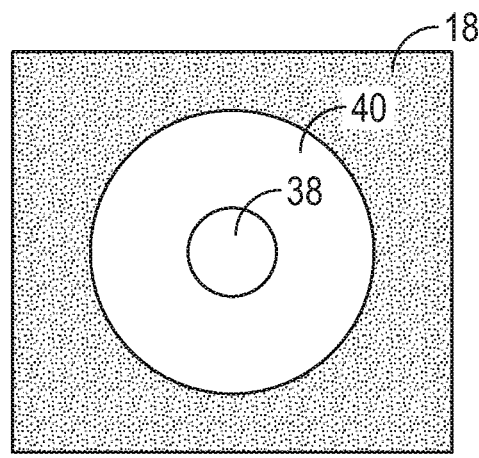
FIGS. 6 and 11 are plan views of embodiments of an integrated circuit, and methods for producing the same.

A base contact 34 is formed from the base contact layer 32 by removing a portion of the base contact layer 32, as illustrated in an embodiment in FIG. 5. As such, the base contact 34 includes the same material(s) as the base contact layer 32. In an exemplary embodiment, selected portions of the base contact layer 32 are removed with a reactive ion etch using silicon tetrachloride and nitrogen trifluoride, but other etch techniques or materials may be used in alternate embodiments. The base contact 34 is positioned overlying the lower contact 16, and the base contact 34 is in electrical communication with the lower contact 16. A base contact photoresist layer 36 is formed and patterned as described above to position the base contact 34 directly overlying the lower contact 16. As such, the base contact photoresist layer 36 is formed and patterned before the base contact 34 is formed from the base contact layer 32. The base contact 34 has a base contact side surface 42 and a base contact top surface area 38 that may be less than a lower contact top surface area 40, as illustrated in an embodiment in a top view in FIG. 6, with continuing reference to FIG. 5. The base contact 34 and the lower contact 16 are illustrated as having a cylindrical shape, but other shapes are also possible, such as cubical shapes. The base contact 34 is formed from the base contact layer 32, where the base contact layer 32 was broadly formed overlying the lower interlayer dielectric layer 14. Therefore, the aspect ratio during formation of the base contact layer 32 was very low such that no voids or gaps are present in the base contact layer 32 or in the resulting base contact 34. The aspect ratio is the ratio of the depth to the width, and the base contact layer 32 was formed over a wide area so the width is very large.

The base contact layer 32 is completely removed from the alignment mark trench 22 during the formation of the base contact 34 from the base contact layer 32 in an exemplary embodiment. The removal of all of the base contact layer 34 from the alignment mark trench 22 may facilitate viewing of the alignment mark trench 22 to simplify alignment techniques during the integrated circuit manufacturing process.

Figure 7:
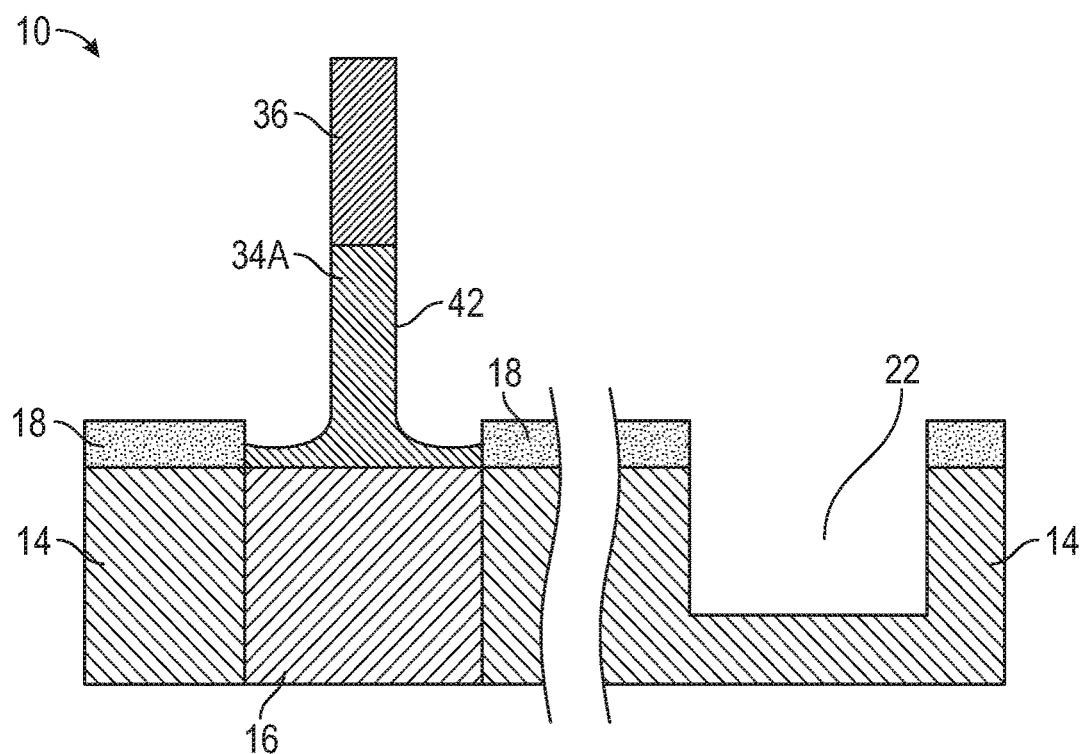

FIG. 7 illustrates an alternate embodiment, where the base contact 34A has a wider base that overlies the lower contact top surface, such that none of the lower contact top surface is exposed. This wide base for the base contact 34A may result from shadowing effects during etching of the base contact layer 32. The embodiment depicted in FIG. 5 is illustrated in the remaining FIGS., but it is to be understood that the embodiment in FIG. 7 is also possible. As such, in the embodiment illustrated in FIG. 5, a portion of the top surface of the lower contact 16 is exposed during formation of the base contact 34. The base contact top surface area 38 may be about the same for the two different embodiments illustrated in FIGS. 5 and 7.

Figure 8:
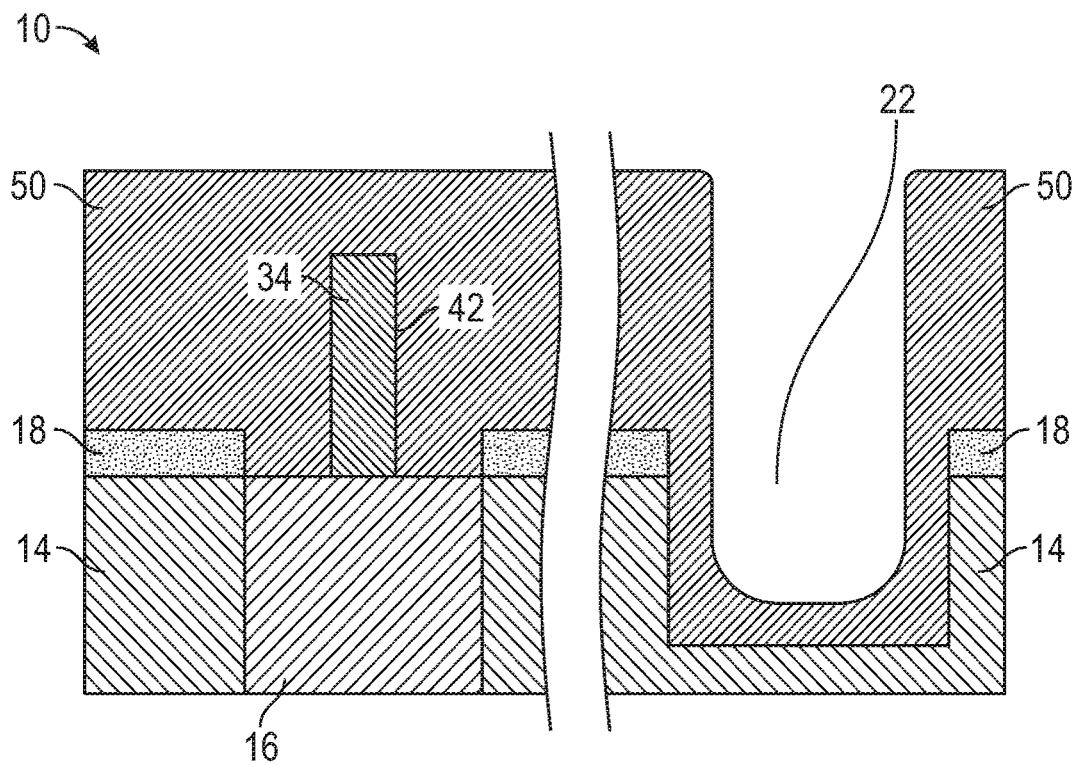

Reference is made to an exemplary embodiment illustrated in FIG. 8. A base interlayer dielectric layer 50 is formed overlying the lower interlayer dielectric layer 14, the lower contact 16, the block layer 28, and the base contact 34, where the base interlayer dielectric layer 50 is an electrical insulator. In an exemplary embodiment, the base interlayer dielectric layer 50 includes silicon dioxide, which may be formed by chemical vapor deposition using tetraethylorthosilicate. However, other insulating materials or other deposition techniques may be used in alternate embodiments. The base interlayer dielectric layer 50 may form a liner within the alignment mark trench 22, where the base interlayer dielectric layer 50 and the lower interlayer dielectric layer 14 may or may not be the same material. The alignment mark trench 22 may remain functional for alignment purposes despite the liner from the base interlayer dielectric layer 50 because of the relatively large size of the alignment mark trench 22. As explained above, the scale of the alignment mark trench 22 is not shown to facilitate illustration on a single page.

The base interlayer dielectric layer 50 is formed after the base contact 34, instead of before the base contact 34. The base interlayer dielectric layer 50 is adjacent to the base contact side surface 42, and may physically contact the base contact side surface 42 in some embodiments. As such, the base interlayer dielectric layer 50 is formed around the previously formed base contact 34.

Figure 9:
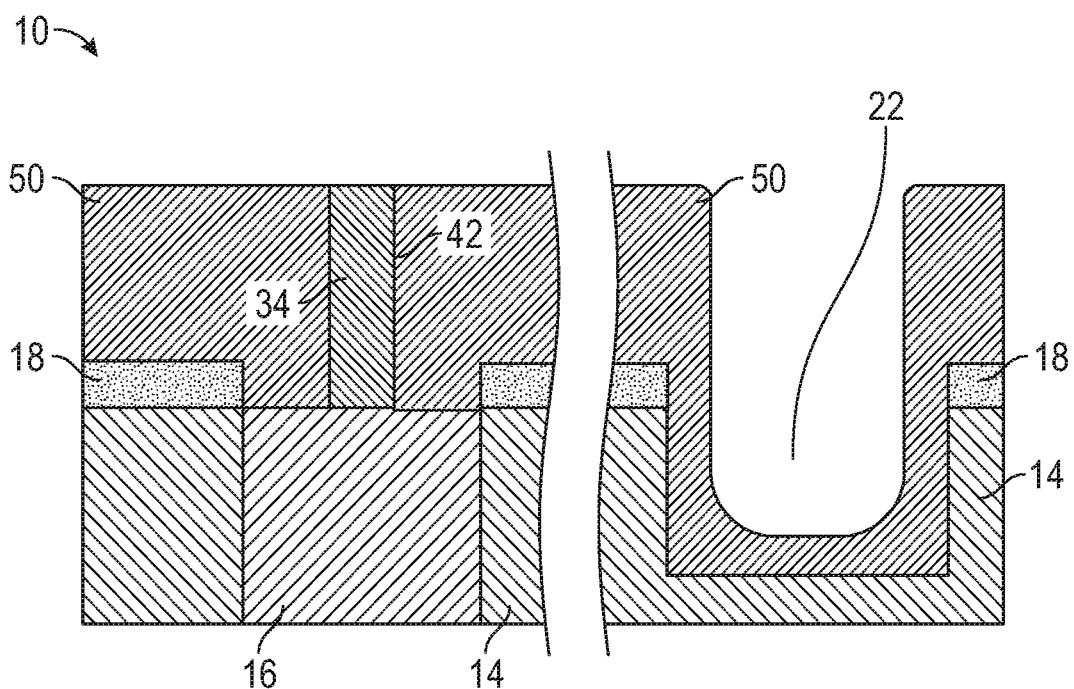

A portion of the base interlayer dielectric layer 50 may be removed to expose a top surface of the base contact 34, as illustrated in an embodiment in FIG. 9. Chemical mechanical planarization may be utilized to lower the base interlayer dielectric layer 50 to expose the top surface of the base contact 34, and the base interlayer dielectric layer 50 may be lowered to essentially any level desired. A portion of the base interlayer dielectric layer 50 remains positioned within the alignment mark trench 22 in an exemplary embodiment.

Figure 10:
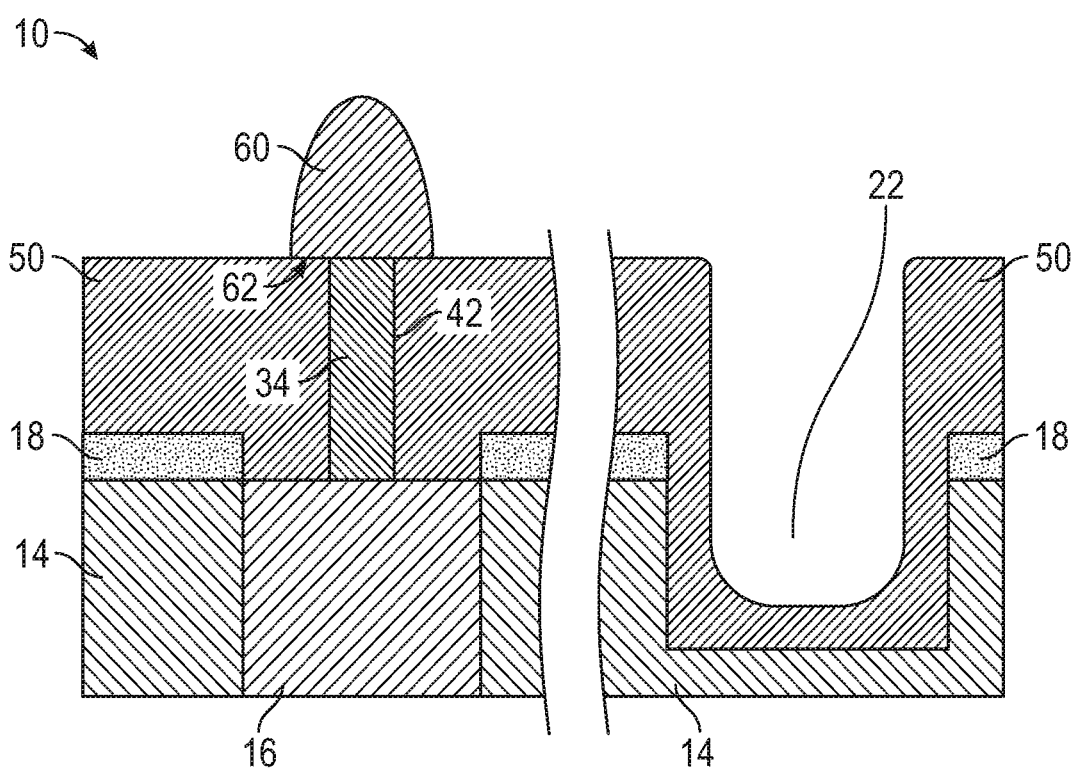

Referring to FIG. 10, a memory cell 60 is formed overlying the base contact 34 and in electrical communication with the base contact 34. In an exemplary embodiment, the memory cell 60 and the base contact 34 are in direct contact with each other, but in alternate embodiments an intervening component may be present. The memory cell 60 has a memory cell bottom surface area 62, illustrated in an exemplary embodiment in FIG. 11 with continuing reference to FIG. 10, where the memory cell bottom surface area 62 is greater than the base contact top surface area 38, illustrated in FIG. 6. As such, none of the base contact 34 extends past the bottom surface of the memory cell 60, and shorts from the base contact 34 to components other than the bottom surface of the memory cell are minimized. The formation of the base contact 34 before formation of the base interlayer dielectric layer 50 allows for a very thin and tall base contact 34 that is free of voids or gaps, where the memory cell bottom surface area 62 is greater than the base contact top surface area 38 so that shorts are minimized.

Figure 11:
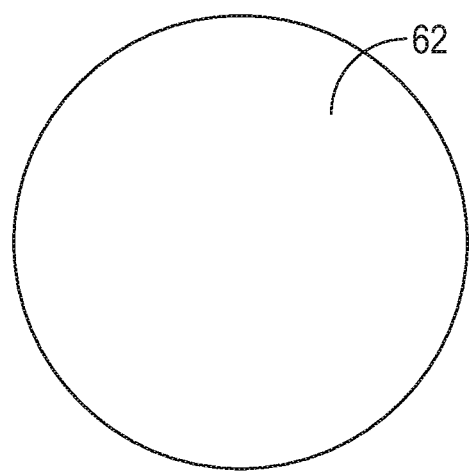

Referring to FIGS. 10 and 11, the memory cell 60 may be a magnetic tunnel junction memory cell in an exemplary embodiment. A magnetic tunnel junction (MTJ) stack (not individually illustrated) may be formed overlying the base contact 34 and a portion of the base interlayer dielectric layer 50. The MTJ stack includes a plurality of individual material layers, which are not individually illustrated. In one embodiment, the MTJ stack includes a free layer overlying the base contact 34, a tunnel barrier layer overlying the free layer, and a pinning layer overlying the tunnel barrier layer. Each of the free layer, the tunnel barrier layer, and/or the pinning layer may include sublayers in various embodiments. The free layer and the pinning layer may be reversed in an alternate embodiment, where the free layer overlies the tunnel barrier layer and the pinning layer underlies the tunnel barrier layer, but the tunnel barrier layer is always positioned between the free and pinning layers. The tunnel barrier layer may be thin, such as from about 1 to about 2 nanometers in thickness, and is an electrical insulator in an exemplary embodiment. The tunnel barrier layer includes magnesium oxide in an exemplary embodiment, but the tunnel barrier layer may include silicon dioxide or other electrical insulating materials in various embodiments. The tunnel barrier layer may be deposited by sputtering magnesium followed by plasma oxidation. The free layer includes cobalt iron boron (CoFeB) in an exemplary embodiment, and the pinning layer includes platinum manganese (PtMn) in one embodiment, but either layer may include other materials in alternate embodiments. The free and pinning layers may be deposited by ion beam sputtering, but other techniques can be used in alternate embodiments.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a lower contact in a lower interlayer dielectric layer
   forming a base contact layer overlying the lower interlayer dielectric layer and the lower contact;
   removing a portion of the base contact layer to form a base contact, wherein the base contact is in electrical communication with the lower contact, and wherein a base contact top surface area is less than a lower contact top surface area;
   forming a base interlayer dielectric layer overlying the lower interlayer dielectric layer after forming the base contact, wherein the base interlayer dielectric layer is adjacent to a base contact side surface; and
   forming a memory cell overlying the base contact, wherein the memory cell is in electrical communication with the base contact.

2. The method of claim 1 further comprising:
   removing a portion of the base interlayer dielectric layer to expose a top surface of the base contact prior to forming the memory cell.

3. The method of claim 1 further comprising:
   forming a base contact photoresist layer prior to forming the base contact.

4. The method of claim 1 wherein:
   forming the base contact layer comprises forming the base contact layer from an electrically conductive material;
   removing the portion of the base contact layer comprises forming the base contact wherein the base contact is an electrical conductor; and
   forming the base interlayer dielectric layer comprises forming the base interlayer dielectric layer wherein the base interlayer dielectric layer is an electrical insulator.

5. The method of claim 1 wherein:
   forming the memory cell comprises forming the memory cell wherein the memory cell is a magnetic tunnel junction memory cell.

6. The method of claim 1 wherein:
   forming the base contact layer comprises forming the base contact layer wherein the base contact layer comprises an element with an atomic number selected from the group of 22 to 33, 40 to 52, 57 to 85, 88 to 117, or a combination thereof.

7. The method of claim 1 wherein:
forming the base contact layer comprises forming the base contact layer wherein the base contact layer comprises an element with an atomic number of from 72 to 85, or a combination thereof.

8. The method of claim 1 wherein forming the base contact layer comprises forming the base contact layer wherein the base contact layer comprises tantalum nitride.

9. The method of claim 1 further comprising:
forming a block layer overlying the lower contact and the lower interlayer dielectric layer prior to forming the base contact layer; and
removing the block layer from over the lower contact prior to forming the base contact layer.

10. The method of claim 1 wherein:
forming the base contact comprises forming the base contact free of a void.

11. The method of claim 1 further comprising:
forming an alignment mark trench in the lower interlayer dielectric layer prior to forming the base contact layer; and
wherein forming the base contact layer comprises forming a portion of the base contact layer within the alignment mark trench.

12. The method of claim 1 wherein:
forming the memory cell comprises forming the memory cell in direct contact with the base contact.

13. The method of claim 1 wherein:
forming the memory cell comprises forming the memory cell with a memory cell bottom surface area, and wherein the memory cell bottom surface area is greater than a base contact top surface area.

14. The method of claim 1 wherein forming the base interlayer dielectric layer comprises forming the base interlayer dielectric layer in direct contact with the base contact side surface.

15. The method of claim 1 wherein:
forming the base contact comprises removing the base contact layer and exposing a portion of the lower contact, wherein the base contact is cylindrically shaped and the lower contact is cylindrically shaped.

16. A method of producing an integrated circuit comprising:
forming a lower contact in a lower interlayer dielectric layer
forming a base contact layer overlying the lower interlayer dielectric layer and the lower contact;
removing a portion of the base contact layer to form a base contact, wherein the base contact is in electrical communication with the lower contact, and wherein the base contact has a base contact top surface area, and wherein a base contact top surface area is less than a lower contact top surface area;
forming a base interlayer dielectric layer overlying the lower interlayer dielectric layer after forming the base contact, wherein the base interlayer dielectric layer is adjacent to a base contact side surface; and
forming a memory cell directly overlying the base contact, wherein the memory cell has a memory cell bottom surface area that is greater than the base contact top surface area, and wherein the memory cell is in electrical communication with the base contact.

17. The method of claim 16 further comprising:
forming an alignment mark trench in the lower interlayer dielectric layer;
wherein forming the base contact layer comprises forming a portion of the base contact layer in the alignment mark trench; and
removing all of the base contact layer from within the alignment mark trench.

18. The method of claim 16 further comprising:
forming a base interlayer dielectric layer after forming the base contact, wherein the base interlayer dielectric layer directly contacts a base contact side surface.

19. The method of claim 16 wherein:
forming the base contact comprises forming the base contact free of a void.

* * * * *